United States Patent
Rebhan et al.

(10) Patent No.: US 9,500,541 B2
(45) Date of Patent: Nov. 22, 2016

(54) METHOD AND DEVICE FOR DETERMINING THE PRESSURE DISTRIBUTION FOR BONDING

(75) Inventors: Bernhard Rebhan, Haag a. H. (AT); Markus Wimplinger, Ried im Innkreis (AT); Jürgen Burggraf, Schärding (AT)

(73) Assignee: EV Group E. Thallner GmbH, St. Florian am Inn (AT)

(*) Notice: Subject to any disclaimer, the term of this patent is extended or adjusted under 35 U.S.C. 154(b) by 138 days.

(21) Appl. No.: 14/119,023

(22) PCT Filed: Jun. 6, 2011

(86) PCT No.: PCT/EP2011/059308
§ 371 (c)(1),
(2), (4) Date: Nov. 20, 2013

(87) PCT Pub. No.: WO2012/167814
PCT Pub. Date: Dec. 13, 2012

(65) Prior Publication Data
US 2014/0102221 A1   Apr. 17, 2014

(51) Int. Cl.
*G01L 1/00* (2006.01)
*G01L 5/00* (2006.01)
*G01L 1/24* (2006.01)
*B30B 15/06* (2006.01)
*H01L 21/66* (2006.01)

(52) U.S. Cl.
CPC .............. *G01L 1/24* (2013.01); *B30B 15/062* (2013.01); *G01L 5/008* (2013.01); *G01L 5/0085* (2013.01); *H01L 22/12* (2013.01)

(58) Field of Classification Search
CPC .................... G01L 1/00; G01L 5/00
USPC ........................................... 73/862.381
See application file for complete search history.

(56) References Cited

U.S. PATENT DOCUMENTS

| 6,033,987 A | 3/2000 | Lin et al. ............... 438/692 |
| 9,099,512 B2 | 8/2015 | Flaim et al. ......... H01L 21/6835 |
| 2008/0087069 A1 | 4/2008 | Renken et al. ............ 73/1.63 |

FOREIGN PATENT DOCUMENTS

| CN | 1383198 A | 12/2002 | ............. H01L 21/66 |
| DE | 41 04 975 | 8/1992 | ............. B30B 15/06 |
| DE | 4104975 A * | 8/1992 | |

(Continued)

OTHER PUBLICATIONS

Office Action issued in connection with corresponding Chinese Patent Application No. 201180071430.7, Oct. 8, 2014 (including English Translation).

(Continued)

*Primary Examiner* — Lisa Caputo
*Assistant Examiner* — Jamel Williams
(74) *Attorney, Agent, or Firm* — Kusner & Jaffe

(57) ABSTRACT

A method and a device for determining the pressure distribution for bonding of a first substrate to a second substrate, with the following steps, especially with the following sequence: placing a measurement layer between a first tool for holding the first substrate and an opposite second tool which is aligned to the first tool for bonding of the substrate, deformation of the measurement layer by bringing the tools closer to one another, measurement of the deformation of the measurement layer and computation of the pressure distribution.

13 Claims, 4 Drawing Sheets

(56) References Cited

FOREIGN PATENT DOCUMENTS

| | | | | |
|---|---|---|---|---|
| DE | 10 2008 025 287 | 12/2009 | ............... | G01L 1/00 |
| EP | 1 182 028 A2 | 2/2002 | ............ | B29C 70/57 |
| JP | 10-311764 | 11/1998 | ............... | G01L 5/00 |
| JP | 10-311764 A | 11/1998 | ............... | G01L 5/00 |
| JP | 2007-114107 | 5/2007 | ............... | G01L 1/18 |
| JP | 2007114107 A * | 5/2007 | | |
| JP | 2007114107 A | 5/2007 | ............... | G01L 1/18 |
| JP | 2009128248 | 6/2009 | ............... | G01L 5/00 |
| TW | 200946628 | 11/2009 | ............... | C09J 5/00 |
| WO | WO 2011/013111 A2 | 2/2011 | ............... | B01L 3/00 |

OTHER PUBLICATIONS

Office Action issued in connection with corresponding Japanese Patent Application No. 2014-513918, Jan. 23, 2015.
International Search Report for International Application No. PCT/EP2011/059308, May 18, 2012.
English language machine translation of DE 4104975. DE 4104975 was cited in an Information Disclosure Statement filed on Nov. 20, 2013.
Office Action issued in corresponding European Patent Application No. 11 727 413.4-1703 dated Jun. 28, 2016.
Office Action issued in corresponding Taiwan Application No. 101120357 dated Mar. 1, 2016 (English translation provided).

* cited by examiner $$F = \frac{3\eta(A_2^4 - A_1^4)}{4\pi V^2 t}$$

METHOD AND DEVICE FOR DETERMINING THE PRESSURE DISTRIBUTION FOR BONDING

FIELD OF THE INVENTION

The present invention relates to a method and a device for determining the pressure distribution in a boundary layer of two tools via the deformation of viscous or plastically deformable media.

BACKGROUND OF THE INVENTION

During a bonding process, the pressure distribution on the wafers which are to be welded is of immense importance. The pressure distribution is a direct property of the surface waviness and surface roughness of the contacting surfaces of all tools which lie over or under the wafer. The tools include mainly heaters, clamping plates, compensation plates, receivers (bond chucks), etc. The knowledge of the surface waviness and surface roughness of the tool whose surface is in direct contact with one of the wafers is not sufficient for computing the pressure distribution. Therefore with ordinary measurement methods such as AFM, laser interferometry, white light interferometry it is not possible to obtain direct and reliable information about the pressure distribution of the bonding process. These measurement methods are used solely and alone for determining the topography of the surface of the tool which is directly in contact with one of the wafers which are to be welded. The homogeneity of the pressure distribution has a very great influence on the bond quality, from which the scrap rate of completely bonded wafers and the scrap rate of the functional components which are located on the wafer follow. Different adverse consequences in the case of insufficient uniformity of the pressure and/or of uneven tools will be briefly mentioned here. In the case of bonding interfaces which cannot be deformed or which can hardly be deformed, for example in metal-metal bonds, an inadequate pressure uniformity leads to poor bonding or no bonding at all at those locations on which the pressure was too low. For example Cu—Cu, Au—Au, Al—Al, W—W, Ni—Ni or Ti—Ti bonds are mentioned.

For moderately deformable bonding interfaces, for example eutectics which pass through a liquid phase during the bond process, a non-uniform pressure distribution can lead to an inhomogeneous structure. For very easily deformable bonding interfaces, for example temporary bonding adhesives, the non-uniform pressure distribution at the start of the bonding process leads solely to an inhomogeneous distribution of the layer thickness of the bonding adhesive.

To determine the pressure distribution, at present in industry mainly pressure films are used whose material reacts sensitively to pressure loading. The material changes color, depending on the corresponding pressure, to different degrees, or changes the intensity of its color. An optical evaluation of the color change or intensity change allows conclusions about the pressure distribution which would act on a perfect wafer which is located between the tools. The pressure films can only be used at room temperature.

The surface quality of all tools which are fixed on top of one another decreases in a plurality of bond steps so that from time to time repeated measurement of the pressure distribution is necessary to minimize the scrap, especially in wafer bonding. The wear is detectable mainly in plastically deformable materials like metal. At an unfavorable pressure distribution which can no longer be tolerated, in the worst case all tools which are fixed on top of one another must be reworked.

Alternative measurement methods for determining the pressure distribution work with force transducers with which however only a very coarse resolution along the receiver or the clamping plate is possible due to the size of the force transducers.

SUMMARY OF THE INVENTION

The object of the present invention is therefore to provide a method which can be integrated into method sequences and which can especially be automated, as well as a corresponding device with which the pressure distribution between the tools can be measured at regular intervals as easily and accurately as possible. Here, the measurement means should be re-usable as much as possible. The method of the present invention should be usable as much as possible under real process conditions.

This object is achieved with the features of the independent claim(s). Advantageous developments of the invention are given in the dependent claims. All combinations of at least two of the features given in the specification, the claims and/or the figures also fall within the framework of the invention. At the given value ranges values which lie within the indicated boundaries will also be considered disclosed as boundary values and will be claimed in any combination. Apparatus features will also be considered disclosed as method features and vice versa.

This invention is based on the fundamental idea of being able to draw conclusions about the pressure distribution as exactly as possible by measurement of the especially local deformation or order of magnitudes of a measurement layer which is placed between the receiver (tool) and the clamping plate (tool). The thickness of the measurement layer during measurement is less than 200 µm, preferably less than 100 µm, more preferably less than 50 µm, even more preferably less than 10 µm, most preferably less than 5 µm, most preferably of all less than 1 µm. The preferred thickness of the measurement layer depends mainly on the bond process which is to be used. If the method of the present invention is to be used to ascertain the pressure distribution for a later metal-metal bond, very thin layers are chosen, preferably smaller than 10 µm, more preferably smaller than 5 µm, most preferably smaller than 1 µm.

For bond processes with moderately deformable bond interfaces, for example eutectic bonds, which run through a liquid phase, layer thicknesses smaller than 50 µm, preferably smaller than 10 µm, most preferably smaller than 5 µm are used.

For bond processes with very easily deformable bond interfaces, for example temporary bonding adhesives, very thick layers are used. The layer thicknesses are preferably smaller than 200 µm, more preferably smaller than 100 µm, most preferably smaller than 50 µm.

Overlaps of the indicated layer thickness ranges are allowed and possible, depending on the exact bond process and material.

Thus, the sole consumable material for the measurement method of the present invention and the measurement device of the present invention is the measurement layer which is deformed by application of pressure or by movement of the clamping plate and receiver onto one another. The relative deformation of the measurement layer which is caused especially parallel to the surface of the wafer is then measured and evaluated, and based on the especially local deformation of the measurement layer conclusions about the pressure distribution in the boundary layer between the tools can be drawn. The method of the present invention can also be used at higher temperatures, preferably above room temperature, more preferably above 200° C., even more preferably above 400° C., most preferably above 600° C. The measurement can be taken especially optically, preferably by cameras. Optics are used to enlarge the layers which are to be measured. A two-dimensional measurement of the deformation in an aspect of the surface of the measurement layer, especially orthogonally to the surface of the wafer, is advantageous. In particular, the change of the diameter or the spreading of the measurement layer can be detected.

According to one advantageous embodiment of the invention it is provided that wafers which are aligned to one another are placed between the measurement layer and the tools which lie over or under it. In this way the deformation of the measurement layer takes place under realistic conditions and the removal of the measurement layer can take place especially without residue after the measurement is taken. Realistic conditions mean states under the actual bond process take place. These states are characterized by increased temperature, vacuum, increase pressure and similar parameters. Moreover the idle times of the device, to the extent measurement takes place in-line, is minimized by the preparation and also the measurement being able to proceed independently of the tools or the bonding apparatus.

To the extent the shape of the measurement layer is measured before deformation, the accuracy of the measurement of deformation is greatly increased. A measurement of the shape of the measurement layer after deformation is absolutely necessary to be able to compute the corresponding force and thus the pressure at the corresponding point.

According to another advantageous embodiment of the invention, it is provided that the measurement layer consists of fluid, especially curable, material. Accordingly, the application or introduction of the measurement layer by a droplet dispenser which enables a controlled and reproducible application, especially in the form of droplets or paths, is enabled. In application in defined size or a defined volume the prior measurement of the measurement layer before deformation of the measurement layer can also be omitted, as a result of which a further acceleration of the method of the present invention becomes possible.

This is further optimized by distribution means, especially in the form of a droplet dispenser, being provided for defined distribution of the measurement layer between the receiver and the clamping plate.

Advantageously it is furthermore provided that the measurement of the deformation, especially of the spreading, takes place on a plurality of positions along the measurement layer, especially optically. The deformation of the measurement layer allows computation of the pressure distribution which has been applied by the tools to the intermediate layer.

By an adhesion-reducing layer being introduced between the measurement layer and at least one of the wafers, the detachment of the measurement layer after completing the measurement of the deformation of the measurement layer is accelerated and simplified.

Other advantages, features and details of the invention will become apparent from the following description of preferred exemplary embodiments and using the drawings.

BRIEF DESCRIPTION OF THE DRAWINGS

The same or equivalent features are identified with the same reference numbers in the figures.

DETAILED DESCRIPTION OF THE INVENTION

Figure 1A:
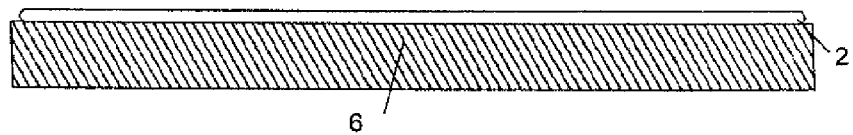
FIGS. 1 to 1g show a method sequence of the present invention according to one embodiment of the present invention.
Figure 1B:
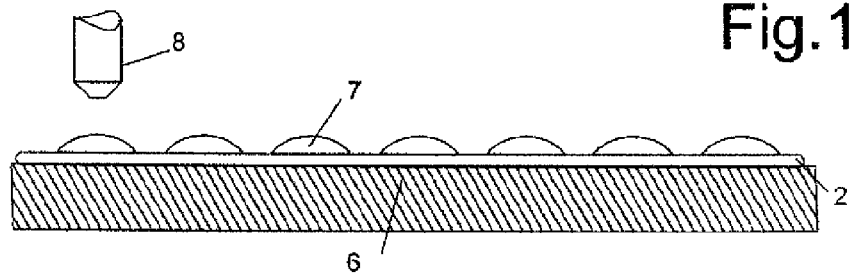

According to FIG. 1a, a wafer 2 which is intended for determination of the pressure distribution is deposited on a plate 6. The plate 6 is for example a sample holder within a so-called droplet dispenser with which reproducible application of droplets or paths which is controlled especially in terms of volume is possible. According to Figure 1b a measurement layer 7, especially in the form of a plurality of droplets of defined size which are located along the grid, is applied to the wafer 2 by a dispenser 8, especially in a preferably lattice-shaped grid or in any other distribution or matrix. The wafer 2 is then placed especially by means of a robot arm on a heating plate 6' with integrated heating devices 10 in order to cure the measurement layer 7 which is present in fluid form by vaporization of the solvent which is contained in the measurement layer. The measurement layer 7 can consist especially of a polymer, preferably a thermoplastic. The heating plate 6' is preferably identical to the plate 6 of the droplet dispenser.

Figure 1C:
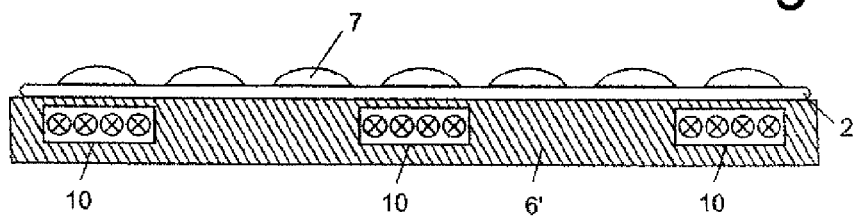
Figure 1D:
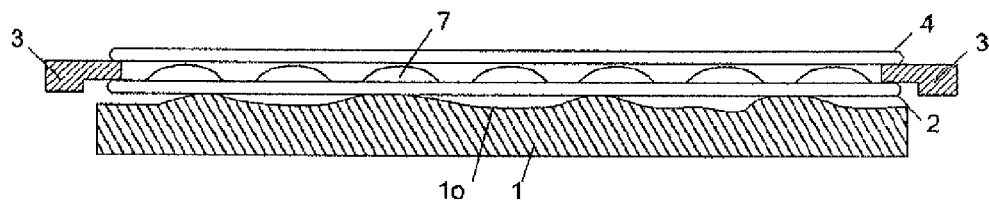
Figure 1E:
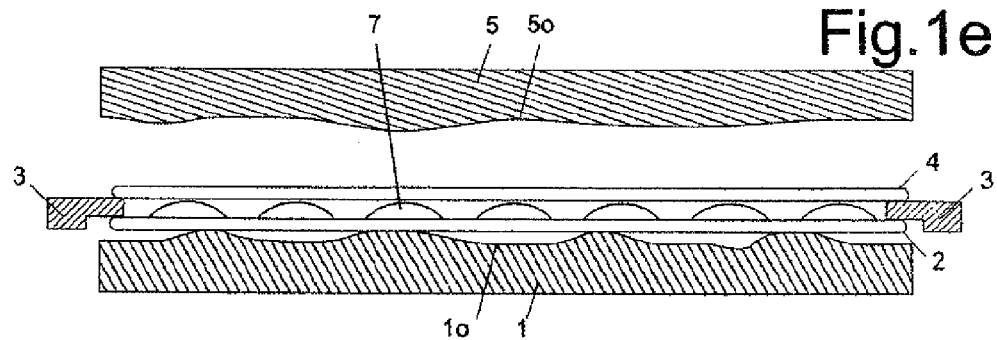

After curing the measurement layer 7 according to FIG. 1c, the wafer 2 is deposited on a tool 1 of the device of the present invention, which tool is made as a receiver, especially by means of a robot arm, and is optionally fixed there. In this way, the wafer 2 lies on one surface 1o of the tool 1 whose surface evenness or roughness or waviness or the resulting pressure distribution along the contact surfaces is to be measured by the measurement method of the present invention or the measurement device of the present invention.

Figures 6, 7:
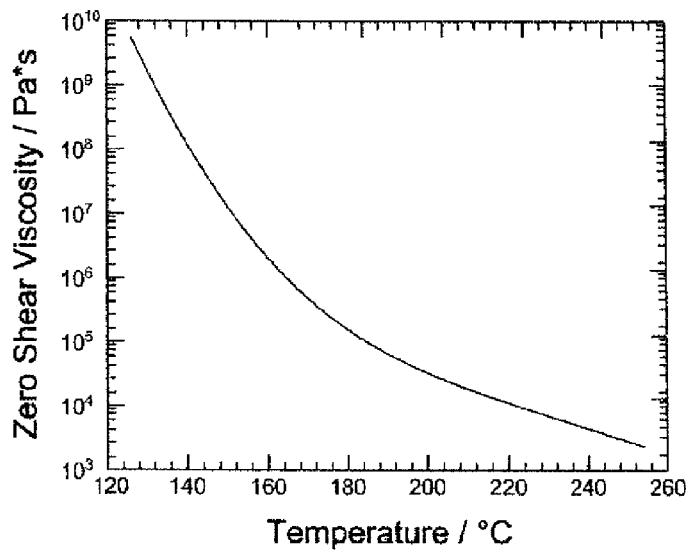
FIG. 6 shows an exemplary viscosity diagram for a material and FIG. 7 shows the formula for computing the force from the parameters of the deformed and undeformed layer 7.

Another wafer 4 is deposited on spacers 3 which can also be used as clamps for fixing of the wafer 2 on the tool 1. If the measurement layer 7 is highly viscous enough to not be deformed under the load of the other wafer 4, a version without spacers 3 is also conceivable. The viscosity of the measurement layer 7 during deformation is especially between $10^3$ and $10^{10}$ Pa·s. FIG. 6 shows by way of example a viscosity curve for a material in the temperature range of 120° C. to 260° C. For an embodiment of the present invention, that material is used whose suitable viscosity characteristic is in the desired temperature range of the process conditions.

The wafers 2 and 4 should preferably be perfectly flat and should not have any surface roughness or waviness. Since these conditions are unrealistic, the wafers 2, 4 which are intended for determination of the pressure distribution should have the same surface roughness values and waviness values as those product wafers which are to be bonded in the later process, The wafers 2, 4 should have the same diameter as the substrate wafers which are to be bonded later. Furthermore, they are advantageously made from the same material. If the wafers 2, 4 and the substrate wafers are single-crystalline, the wafers 2, 4 preferably have the same crystallographic orientation as the substrate wafers which are to be bonded later. Thus it can be ensured that the measurement results exactly represent the pressure distribution which can actually be expected in the bond interface of the product wafer, As the wafer 4 especially a glass wafer is conceivable of the present invention in order to enable a prompt evaluation by means of evaluation optics as measurement means for measuring the deformation. The evaluation can therefore take place after deformation of the measurement layer 7 with the wafers 2, 4 not yet detached.

The deformation of the measurement layer 7 or of the individual droplets takes place by a tool 5 which is made as a clamping plate by the tool 5 being caused to approach the tool 1. One tool surface 5o of the tool 5 likewise has surface irregularities. Furthermore all tools 1', 1", 5', 5" likewise have uneven surfaces in general over or under the tools 5 and 1 respectively. Accordingly the pressure distribution of the combination of all tools 5, 5' . . . and 1, 1' . . . is determined by the method of the present invention by the deformation of the measurement layer 7 being evaluated. In the method of the present invention preferably wafers 2, 4 are used which correspond to the wafers which are used later in the actual bond process in material, thickness, surface roughness, waviness and other parameters.

Figure 1F:
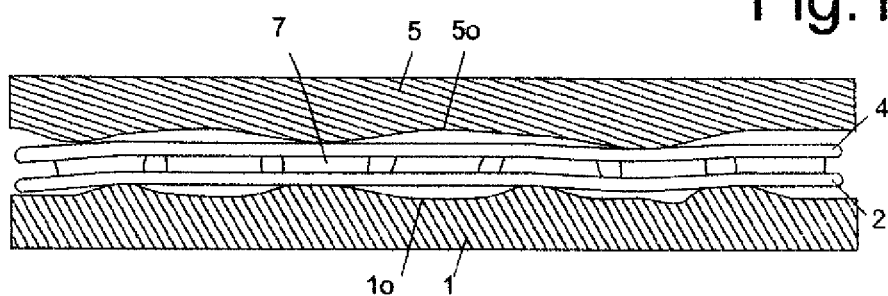
Figure 1G:
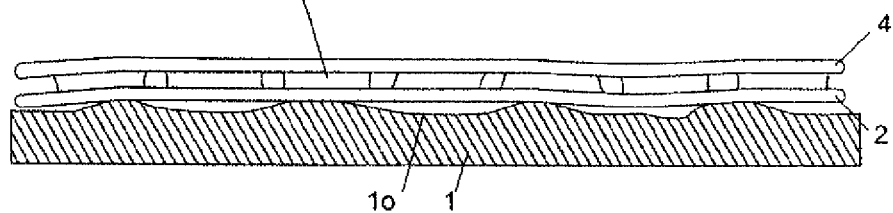

The deformation of the measurement layer 7 is shown in FIG. 1f. When pressure is applied to the measurement layer 7 by moving the tool 5 toward the tool 1, the measurement layer 7 is plastically deformed. Due to the unevenness, different deformation arises at different locations so that due to the different deformation of the droplet an evaluation of the measurement result by an evaluation device is enabled. At sites where the diameter of the droplets is more dramatically increased, the tool 5 on its clamping surface 5o is accordingly nearer the surface lo of the tool 1 while for the opposite effect the distance is greater.

Then, after the tool 5 and the tool 1 are moved apart the deformation of the measurement layer 7 is measured on a plurality of measurement points which are distributed on the measurement layer 7 by measurement means 11, especially optical measurement means 11, preferably optical microscopes and/or CCD cameras which have a corresponding resolution. Advantageously it is provided here that the measurement is taken through the wafer 4, for example by the wafer being transparent to optical light, especially as a glass wafer. Alternatively, measurements can be taken by means of infrared radiation for a wafer 4 which is opaque to optical light.

Figure 2:
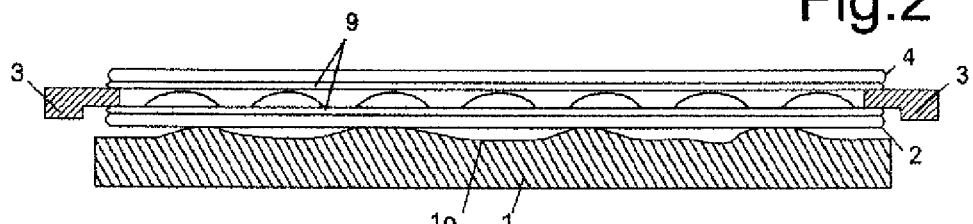
FIG. 2 shows an alternative embodiment of the method of the present invention.

The alternative embodiment which is shown in FIG. 2 is characterized in that between the measurement layer 7 and especially each of the wafers 2, 4 there is an adhesion-reducing layer 9 on the wafer which is applied to the wafers 2, 4 before the application of the measurement layer 7.

Figure 3:
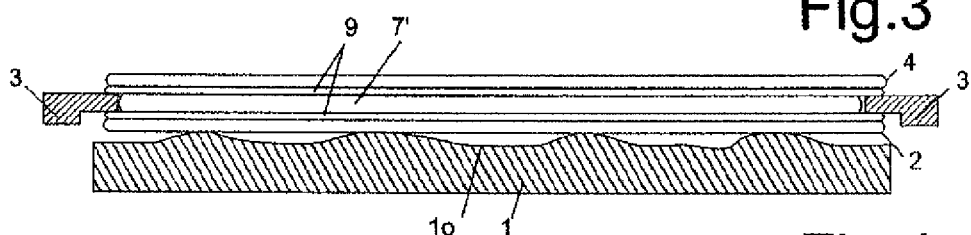
FIG. 3 shows a further alternative embodiment of the method of the present invention.

In the embodiment according to FIG. 3, there is a measurement layer 7' which is applied in a blanket manner, especially over the entire wafer 2 with a thickness which is as constant as possible. In this embodiment, the deformation of the measurement layer 7' is measured based on the thickness change along the measurement layer at a plurality of positions so that a thickness map of the measurement layer 7' can be determined, especially by measurement before and after the deformation. The measurement means can be ultrasonic measurement instruments or interferometers, preferably laser interferometers. The application of pressure/deformation of the measurement layer 7' and the surface irregularities of the compression plate 5 and/or receiver 1 compact, displace, thin, therefore deform the measurement layer 7' accordingly at different positions; in this case this results in a change in thickness since the measurement layer 7' can be plastically deformed.

Figure 4:
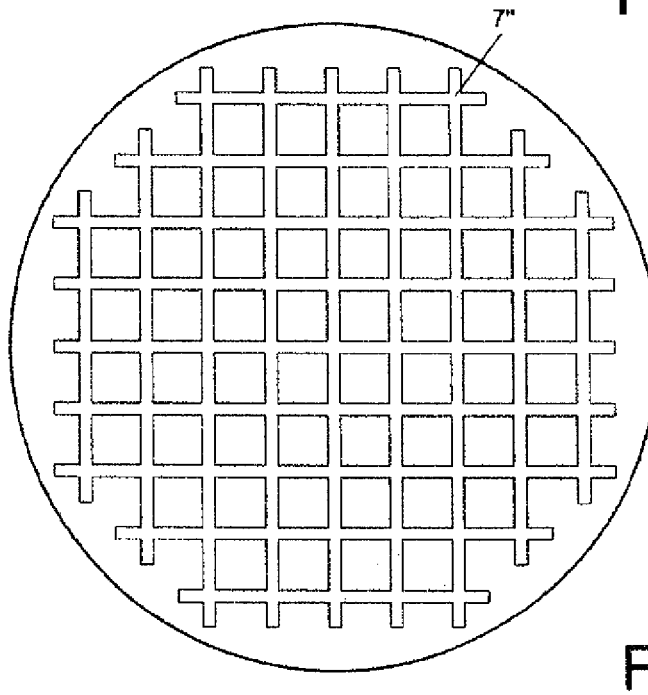
FIG. 4 shows a measurement layer of the present invention in a plan view.
Figure 5:
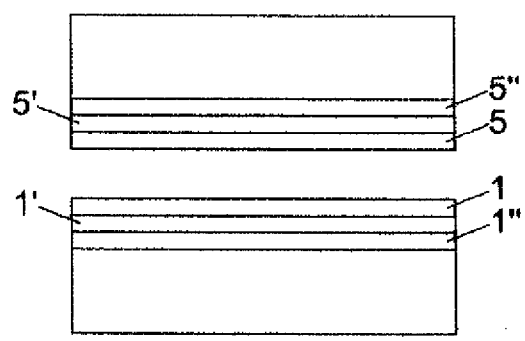
FIG. 5 shows a side view of a device of the present invention for executing the method.

In the version shown in FIG. 4, the measurement layer 7" is a lattice with paths, the paths running orthogonally to one another in this case. An angled arrangement of the paths to one another would likewise be conceivable. It is important here that the path thickness is as uniform as possible so that a reproducible measurement of the deformation is enabled.

The pressure distribution is computed by the formula in FIG. 7. The viscosity η, the cross sectional area $A_1$ of the droplet before deformation, the cross sectional area $A_2$ of the droplet after deformation, the droplet volume V and the compression time t are used to compute the force F which is acting on the droplet. The pressure is computed by the corresponding normalization to the droplet cross section. By computing the forces or pressures at different positions of the wafer a force map or pressure map can be prepared. The cross sectional areas $A_1$ and $A_2$ are the average cross sectional areas of the cylinders which are formed from the droplets of the layer 7 and which arise when the plate 4 is deposited on the layer 7 (FIG. 1f).

In the embodiments 7' and 7" of the present invention, an absolute calculation of the pressure distribution does not take place. In these two embodiments of the present invention, the pressure distribution of the layer 7' or of the lattice 7" is evaluated after an appropriately long time, preferably a few minutes. The thickness distribution as a function of the site represents a direct depiction of the pressure distribution at the instant of contact. This relative thickness distribution is sufficient to obtain an at least approximate statement about the weak sites of the tools. The embodiments 7' and 7" of the present invention are only used when the tool is to be tested for the bond behavior of very soft bond interfaces, for example bonding adhesives. In the embodiment 7" of the present invention, an attempt can also be made to obtain conclusions about the (relative) pressure distribution from the line spreading of the lattice which arises. For the embodiments 7' and 7" of the present invention conventionally low bond forces smaller than 15 kN, preferably smaller than 10 kN, even more preferably smaller than 5 kN, are used.

REFERENCE NUMBER LIST 1 tool
1o tool surface
2 wafer
3 spacer
4 wafer
5 tool
5o tool surface
6, 6' plate
7, 7', 7" measurement layer
8 dispenser
9 adhesion-reducing layers
10 heating device
11 measurement means

The invention claimed is:

1. A method for determining pressure distribution for bonding of a first substrate to a second substrate, the method comprising:

applying a measurement layer to any one of, the first substrate, the second substrate, and the first and second substrate, depositing the first substrate on a first tool for holding the first substrate, introducing the second substrate in a region between the first substrate and a second tool located opposite the first tool, the second tool aligned to the first tool for bonding of the first substrate to the second substrate, deforming the measurement layer to alter its shape by bringing the first and second tools closer to one another, measuring deformation of the measurement layer, and computing the pressure distribution based on the measurement of the deformation.

2. A method for determining pressure distribution for bonding of a first substrate to a second substrate, the method comprising:

introducing a measurement layer between a first tool for holding the first substrate and a second tool opposite the first tool, the second tool aligned to the first tool for bonding of the first substrate to the second substrate, deforming the measurement layer to alter its shape by bringing the first and second tools closer to one another, measuring deformation of the measurement layer, computing the pressure distribution based on the measurement of the deformation, and measuring the shape of the measurement layer before deformation of the measurement layer.

3. A method for determining pressure distribution for bonding of a first substrate to a second substrate, the method comprising:

introducing a measurement layer between a first tool for holding the first substrate and a second tool opposite the first tool, the second tool aligned to the first tool for bonding of the first substrate to the second substrate, wherein the measurement layer includes a fluid, deforming the measurement layer to alter its shape by bringing the first and second tools closer to one another, measuring deformation of the measurement layer, and computing the pressure distribution based on the measurement of the deformation.

4. A method for determining pressure distribution for bonding of a first substrate to a second substrate, the method comprising:

introducing a measurement layer between a first tool for holding the first substrate and a second tool opposite the first tool, the second tool aligned to the first tool for bonding of the first substrate to the second substrate, wherein the measurement layer is distributed between the first tool and the second tool using dispensers, deforming the measurement layer to alter its shape by bringing the first and second tools closer to one another, measuring deformation of the measurement layer, and computing the pressure distribution based on the measurement of the deformation.

5. The method as claimed in claim 1, wherein deformation of the measurement layer is measured at a plurality of positions along the measurement layer.

6. A method for determining pressure distribution for bonding of a first substrate to a second substrate, the method comprising:

introducing a measurement layer between a first tool for holding the first substrate and a second tool opposite the first tool, the second tool aligned to the first tool for bonding of the first substrate to the second substrate, wherein the measurement layer is introduced by application of droplets, deforming the measurement layer to alter its shape by bringing the first and second tools closer to one another, measuring deformation of the measurement layer, and computing the pressure distribution based on the measurement of the deformation.

7. The method as claimed in claim 1, wherein the method further comprises:

introducing an adhesion-reducing layer between the measurement layer and at least one of: (i) the first substrate located between the measurement layer and the first tool and (ii) the second substrate located between the measurement layer and the second tool.

8. The method as claimed in claim 1, wherein the method further comprises:

aligning the first substrate located between the measurement layer and the first tool with the second substrate located between the measurement layer and the second tool.

9. The method as claimed in claim 2, wherein the shape of the measurement layer is measured after introducing the measurement layer between the first tool and the second tool.

10. The method as claimed in claim 3, wherein the fluid is a curable material.

11. The method as claimed in claim 10, wherein the curable material is plastically deformable after curing.

12. The method as claimed in claim 5, wherein deformation of the measurement layer is optically measured at the plurality of positions along the measurement layer.

13. The method as claimed in claim 6, wherein said droplets are applied to the first substrate and/or the second substrate.

* * * * *